Nov. 27, 1951 P. R. BELL, JR 2,576,329
VARIABLE BANDWIDTH CIRCUIT
Filed May 3, 1946

INVENTOR
PERSA R. BELL JR.
BY M. C. Hayes
ATTORNEY

Patented Nov. 27, 1951 2,576,329

UNITED STATES PATENT OFFICE 2,576,329

VARIABLE BAND WIDTH CIRCUIT

Persa R. Bell, Jr., Oak Ridge, Tenn., assignor, by mesne assignments, to the United States of America as represented by the Secretary of the Navy Application May 3, 1946, Serial No. 666,876

5 Claims. (Cl. 179—171)

This invention relates to electronic amplifier circuits, and more particularly to amplifiers having variable pass band characteristics.

It is well known in the art that an electronic amplifier will provide essentially equal amplification of all signals having a frequency between two limits, which frequency limits specify the pass band, or bandwidth, of the amplifier. For certain applications it may be desirable to have a narrow bandwidth amplifier to reduce the amount of extraneous signal, known as noise, and permit the successful amplification of lower level input signals. In other applications, faithful reproduction of the input signal may require an increased bandwidth. Since, in general, the bandwidth of an amplifier cannot be increased without a corresponding decrease in the gain, the design of an amplifier with variable bandwidth becomes quite difficult. In the present invention an amplifier circuit is provided in which the bandwidth may be varied, with the gain being held essentially constant.

Accordingly, it is a primary purpose of this invention to generally improve electronic amplifier circuits.

It is also an object of this invention to provide an electronic amplifier in which the band of frequencies which may be successfully amplified is variable.

It is further an object of this invention to provide an electronic amplifier circuit in which the bandwidth may be varied without essential change in the gain of the amplifier stage.

The foregoing and other objects of the invention will become apparent upon a careful consideration of the detailed description when taken with the accompanying drawings in which.

Figure 1:
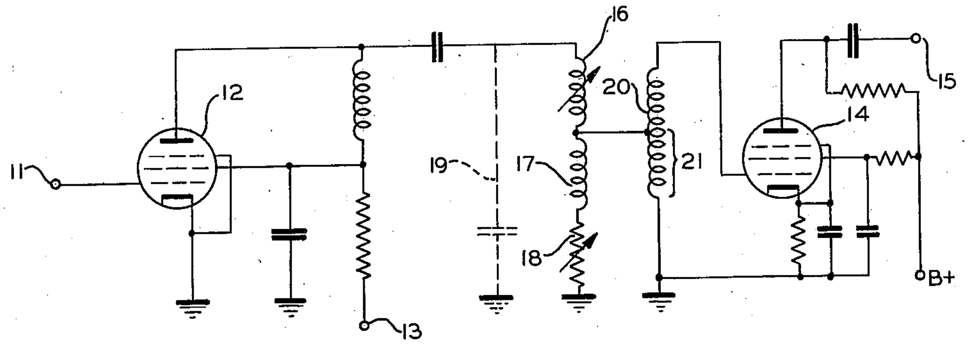
Fig. 1 is a circuit diagram showing one embodiment of the invention.

Referring to the drawings and more particularly to Fig. 1, the invention is shown in relation to other components of an amplifier stage. The input signal at terminal 11 is applied to the control grid of electron tube 12 which is shunt connected to a source of positive voltage at terminal 13. The output of this stage is coupled to a second amplifier stage consisting of electron tube 14, and the output is taken from terminal 15. An analysis of the operation of the coupling circuit is as follows. Variable inductance 16, inductance 17, and variable resistance 18, together with stray capacitance 19, shown by dotted lines in Fig. 1, that shunts these elements to ground, forms a parallel resonant circuit. The Q, or quality factor, of this parallel resonant circuit can be adjusted by means of resistance 18. When the value of resistance 18 is small, the Q of the parallel resonant circuit is large and the pass band of the circuit is narrow. When resistance 18 is made larger, loading the resonant circuit, the Q decreases, and the pass band increases in width. Assuming that inductance 17 is equal to zero, then as the value of resistance 18 is reduced from a large value to a low value, the voltage coupled to the secondary coil 20, theoretically remains constant. However, in actual practice, at very low values of resistance 18, the voltage coupled to the secondary coil 20 falls off due to tube and coil losses. By including the inductance 17, this drop in the voltage coupled to coil 20 can be eliminated because as resistance 18 is decreased, the Q of the parallel resonant circuit increases, which in turn increases the voltage which is coupled to secondary coil 20. It is apparent then, that the voltage which is coupled to the secondary coil 20 depends not only on the value of resistance 18 but also on the value of inductance 17. By proper selection of the value of inductance 17, the gain of the circuit for low values of resistance 18, that is, the high Q condition, can be made any desired value relative to the gain in the low Q condition. After proper selection of inductance 17, then, resistance 18 serves as a control of the bandwidth of the amplifier without serious sacrifice in gain of the circuit.

Part 21 of secondary coil 20 forms an impedance coupling link between inductance 16 and inductance 20. As the coupling of these two coils is made greater by increasing the relative size of part 21 of inductance 20, the pass band curve will tend to become double peaked. The extent of these double peaks can be controlled by varying the value of part 21 of inductance 20.

The center frequency of the band-pass curve for the circuit can be adjusted by means of variable inductance 16 in the normal fashion.

Figure 2:
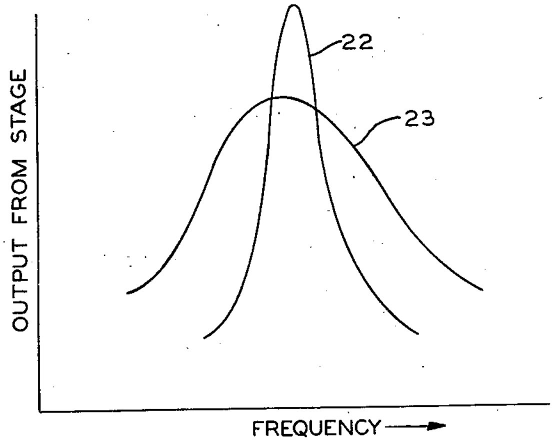
Fig. 2 shows representative frequency response curves obtainable by this invention.

Fig. 2 shows representative frequency response curves of the output of this circuit. Curve 22 is the frequency response curve for the circuit when the value of resistance 18 is low, that is, in the high Q condition. Curve 23 illustrates how the pass band is broadened when the value of resistance is increased. It is shown by these curves that the pass band can be appreciably broadened without serious sacrifice of gain.

The invention described in the foregoing specification need not be limited to the details shown, which is considered illustrative of one form the invention may take.

What is claimed is:

1. A variable bandwidth coupling circuit for electronic amplifiers comprising, a variable inductance, a fixed inductance, a variable resistance, said elements connected in series in the order named, the self-capacitance of said elements in combination with said inductances forming a parallel resonant circuit, and a second fixed inductive element impedance coupled to said resonant circuit at the junction of said first fixed inductance and said variable inductance, the magnitude of said first fixed inductance determining the relative gain of said coupling circuit at different bandwidths, the magnitude of said variable resistance substantially determining the pass band of said coupling circuit, and the magnitude of said variable inductance substantially determining the center frequency of said pass band of said coupling circuit.

2. In a radio frequency amplifier, a variable bandwidth coupling circuit comprising, a variable inductance, a first fixed inductance and a variable resistor serially connected in the order named, the self-capacitance of said inductances and resistor in combination with said inductances and resistor forming a parallel resonant circuit, a second fixed inductance, and a conductor connecting the junction of said variable inductance and said first fixed inductance to said second fixed inductance, the magnitude of said first fixed inductance determining the relative gain of said coupling circuit at different bandwidths, means for varying said resistance to control the pass band of said circuit, and means for adjusting the value of said inductance for controlling the center frequency of the pass band of said coupling circuit.

3. In a radio frequency amplifier, at least two electron tubes each having input and output circuits, a network coupling the output circuit of the first tube to the input circuit of the second tube comprising, a variable inductance, a first fixed inductance and a variable resistor serially connected in the order named in shunt with said first tube, the self-capacitance of said elements in combination with said inductances forming a parallel resonant circuit, a second fixed inductance coupled to the input circuit of the second tube, and a conductor coupling the junction of said first fixed inductance and said variable inductance to a desired point on said second fixed inductance.

4. In a radio frequency amplifier, at least two electron tubes each having an input and an output circuit, a network coupling the output circuit of the first tube to the input circuit of the second tube comprising, a variable inductance, a first fixed inductance and a variable resistor serially connected in the order named in shunt with said first tube, the self-capacitance of said elements in combination with said inductances forming a parallel resonant circuit, the Q of said resonant circuit being adapted to be raised and lowered by decreasing and increasing respectively the value of said resistance, a second fixed inductance coupled to the input circuit of the second tube, and a conductor connecting the junction of said variable inductance and said first fixed inductance to said second fixed inductance, the inductance of said first fixed inductance being of such a magnitude that the voltage coupled to said second fixed inductance is substantially constant with variations in magnitude of said variable resistor.

5. In a radio frequency amplifier, at least two electron tubes each having an input and an output circuit, a network coupling the output circuit of the first tube to the input circuit of the second tube comprising, a variable inductance, a fixed inductance and a variable resistor serially connected in the order named in shunt with said first tube, the stray capacitance of said element in shunt therewith forming a parallel resonant circuit, the bandwidth of said coupling circuit being adjustable by variations in the magnitude of said resistor, a second fixed inductance coupled to the input circuit of the second tube, and a conductor connected between the junction of said first fixed inductance and said variable inductance and an adjustable tap on said second fixed inductance, the magnitude of said first variable inductance determining the center frequency of the pass band of said network and the inductance of said first fixed inductance being of such a magnitude that the voltage coupled to said second tube are substantially constant with changes in bandwidth caused by variations in the magnitude of said resistor.

PERSA R. BELL, Jr.

REFERENCES CITED

The following references are of record in the file of this patent:

UNITED STATES PATENTS

| Number | Name | Date |
|---|---|---|
| 2,051,898 | Roberts | Aug. 25, 1936 |
| 2,052,703 | Farnham | Sept. 1, 1936 |
| 2,404,270 | Bradley | July 16, 1946 |